(12) United States Patent
Brandt

(10) Patent No.: US 7,176,672 B2
(45) Date of Patent: Feb. 13, 2007

(54) DC CURRENT SENSOR

(75) Inventor: Randy L. Brandt, Orange, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/985,221

(22) Filed: Nov. 9, 2004

(65) Prior Publication Data

US 2006/0097713 A1    May 11, 2006

(51) Int. Cl.
*G01R 33/07* (2006.01)

(52) U.S. Cl. .............................. 324/117 H; 324/117 R

(58) Field of Classification Search ..... 324/117 R–117 H, 126–127; 336/220–221
See application file for complete search history.

(56) References Cited

U.S. PATENT DOCUMENTS

| | | | |
|---|---|---|---|
| 4,706,017 A * | 11/1987 | Wilson | 324/127 |
| 5,172,052 A | 12/1992 | Wells | |
| 5,221,894 A * | 6/1993 | Herwig | 324/117 R |
| 5,223,789 A * | 6/1993 | Katsuyama et al. | 324/127 |
| 5,483,161 A * | 1/1996 | Deeter et al. | 324/244.1 |
| 5,534,837 A | 7/1996 | Brandt | |

* cited by examiner

*Primary Examiner*—Vinh P. Nguyen
(74) *Attorney, Agent, or Firm*—MacPherson Kwok Chen & Heid LLP; Tom Chen

(57) ABSTRACT

A DC current sensor has a core having a magnetically permeable material. A permeability measurement winding is formed around at least a portion of the core. The core is placed within a magnetic field of a conductor such that measurement of a permeability of the core via the permeability measurement winding facilitates determination of current flow through the conductor.

16 Claims, 3 Drawing Sheets

DC CURRENT SENSOR

TECHNICAL FIELD

The present invention relates generally to current measurement devices and, more particularly, to a DC current sensor that measures the magnetic field proximate a conductor based upon the interaction of orthogonal magnetic fields within a magnetic material.

BACKGROUND

Current sensors for use in the measurement of current in a conductor are well known. Such current sensors are commonly used in troubleshooting and control applications. For example, it may be important to know how much current is flowing through a wire that drives a motor in order to verify that the motor is operating properly.

AC current sensors do not typically require that a circuit be broken in order to make a current measurement. AC current sensors typical comprise inductive elements into which current is induced by the changing magnetic field surrounding an AC current conductor. However, DC current is not suitable for inducing current into an inductive element in this manner.

DC current measurement devices that required that a circuit be broken in order to make a measurement are common. For example, moving coil current meters (galvanometers) are used by breaking a circuit and inserting the meter into the circuit.

However, it is frequently desirable to measure the DC current in a conductor without having to break the circuit and thereby temporarily interrupt current flow. In many applications, breaking the circuit is difficult. For example, breaking the circuit may involve cutting and splicing a wire. In many applications, breaking the circuit is undesirable because it will interrupt the operation of an electrical device.

As a result, there is a need for a current measurement device that does not require breaking of the circuit for which current is being measured. In response to this need, the prior art has provided Hall effect current sensors. Hall effect current sensors produce a voltage that is proportional to a magnetic field within which the sensor is disposed, according to well known principles. Since the magnetic field surrounding a conductor is proportional to the amount of current flowing therethrough, a Hall effect current sensor indirectly measures the amount of current in the conductor.

Although Hall effect current sensors have proven generally suitable for their intended use, Hall effect current sensors do suffer from inherent disadvantages that tend to detract from their overall desirability. For example, Hall effect current sensors require the use of a precise DC excitation source. As those skilled in the art will appreciate, the use of a precise DC excitation source has substantial disadvantages. The excitation source undesirably adds weight and bulk to the current measuring system, making its use undesirable for spacecraft and many other applications. The excitation source must also be calibrated to assure that it is operating properly. Additionally, precise DC excitation sources tend to be costly.

Thus, there exists a need in the art for a DC current measurement device that does not require breaking of the circuit and which further does not required the use of a precise DC excitation source, such as that required by contemporary Hall effect current sensors.

SUMMARY

Systems and methods are disclosed herein to provide for the measurement of DC current in a conductor. In accordance with one aspect of the present invention, a permeability of a core varies in proportion to the strength of a magnetic field produced by current flow within the conductor. The permeability of the core is used to provide an indirect measurement of the DC current in the conductor.

More specifically, in accordance with one embodiment of the present invention, a core has a winding formed therein such that a magnetic field produced by the winding is generally perpendicular with respect to the magnetic field produced by the conductor. A voltage is applied to the winding and the resultant current flow through the winding is determined. The amount of current flowing through the winding is indicative of a permeability of the core and consequently is indicative of the amount of current flowing though the conductor.

In accordance with another embodiment of the present invention, the core comprises two generally orthogonal windings, both of which are formed therein such that a magnetic field produced by each winding is generally perpendicular with respect to the magnetic field produced by the conductor. One of the windings is used to determine a permeability of the core and the other winding is used to vary a permeability of the core in a manner that tends to compensate for temperature variations of the core.

In accordance with another embodiment of the present invention, a flux concentrator, such as a toroid, is disposed about the conductor. The core is disposed within a gap of the flux concentrator so as to enhance a sensitivity and/or precision of current measurement. The core may comprise a low profile, generally planar core, so as to better fit within the gap.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
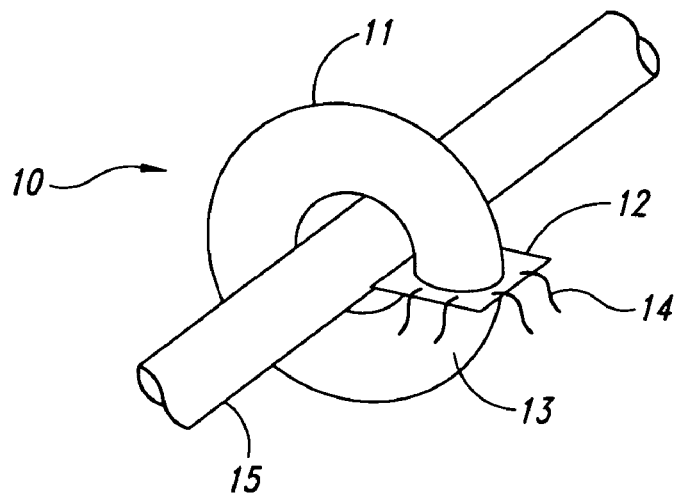
FIG. 1 is a semi-schematic perspective view of an exemplary current measurement device formed according to one embodiment of the present invention, wherein the current measurement device comprises a toroid and a planar core disposed within a gap of the toroid.

Referring now to FIG. 1, current can be measured in a conductor 15 by the DC current sensor of the present invention. The DC current sensor generally comprises a flux concentrator, such as toroid 11, and a plate or generally planar core 12. Toroid 11 generally surrounds a portion of conductor 15 and tends to concentrate magnetic flux within an air gap 25 (best shown in FIG. 3) of toroid 11. Core 12 can be disposed at least partially within the gap 25, such that magnetic flux within gap 25 can affect a magnetic permeability of core 12.

The use of a generally planar core facilitates the use of a smaller air gap than can be accomplished with the use of a thicker core. Smaller air gaps better concentrate magnetic flux and thus enhance the performance of the DC current sensor of the present invention. However, a thicker, non-planar core may alternatively be used, if desired. For example, a generally cubic, spherical, or cylindrical core may be used.

Figure 2:
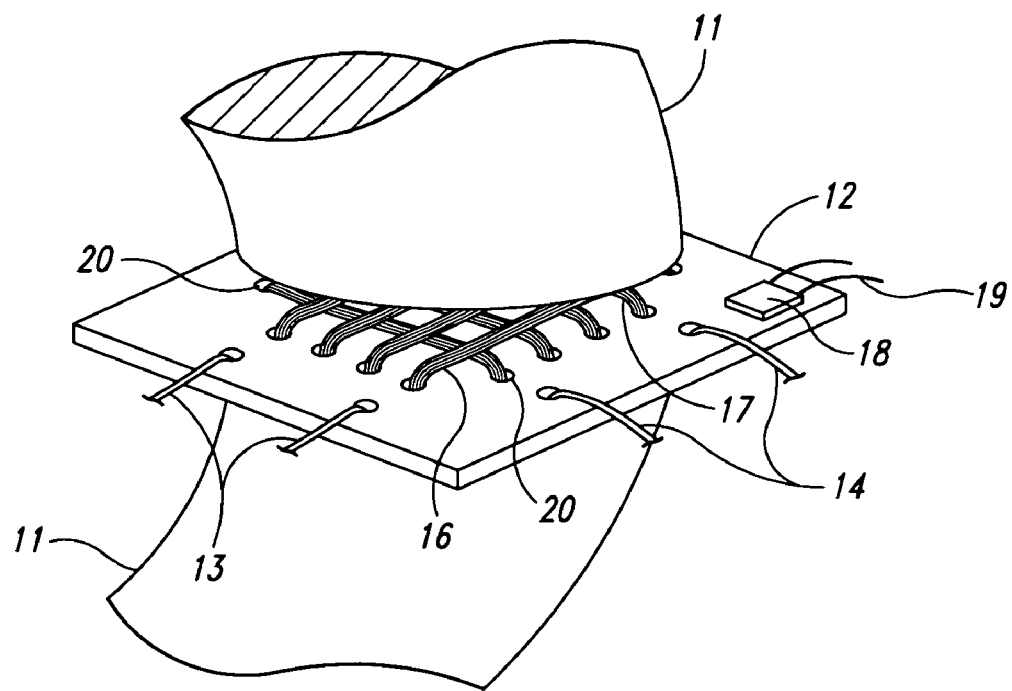
FIG. 2 shows an enlarged perspective view of the planar core disposed within the gap of the toroid of FIG. 1.
Figure 3:
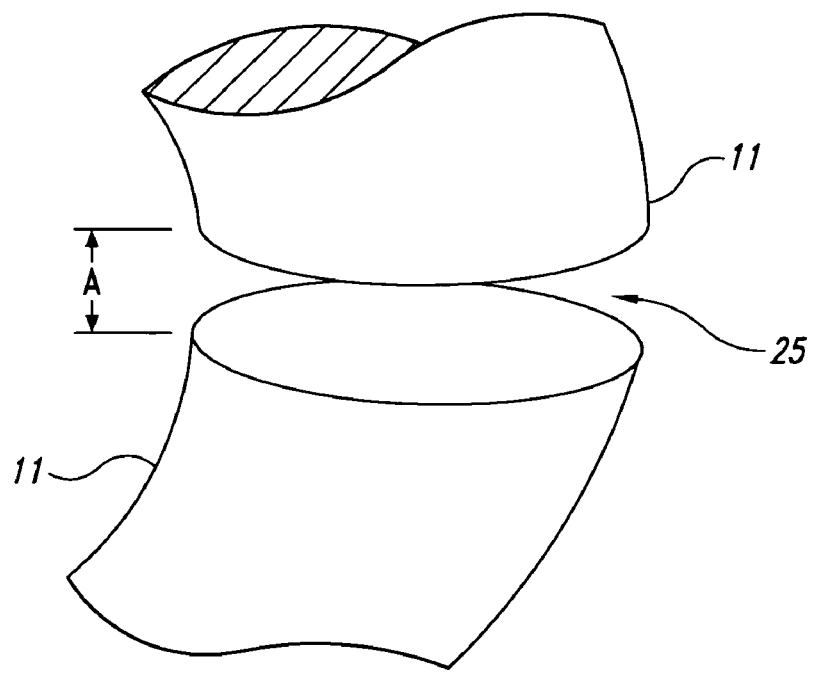
FIG. 3 shows the toroid of FIG. 2, with the core removed from the gap thereof.
Figure 4:
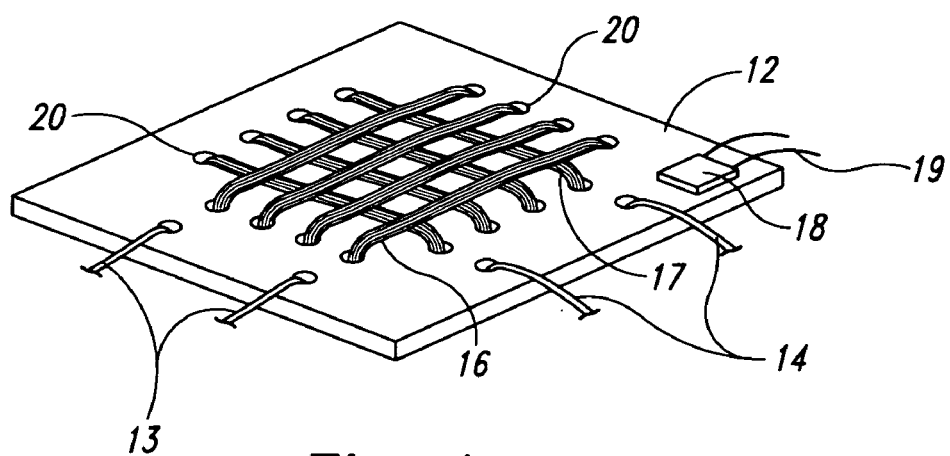
FIG. 4 shows the planar core removed from the gap of the toroid of FIG. 2.

Referring now to FIGS. 2–4, a permeability measurement winding 16 can be formed about at least a portion of core 12. The permeability measurement winding 16 can be oriented such that a magnetic field produced thereby is generally orthogonal with respect to the magnetic field produced by conductor 15. Similarly, an optional temperature compensation winding 17 may be formed about at least a portion of core 12. The temperature compensation winding 17 can be oriented generally orthogonally with respect to permeability measurement winding 16. The temperature compensation winding 17 can also be oriented such that a magnetic field produced thereby is generally orthogonal with respect to the magnetic field produced by conductor 15.

Both permeability measurement winding 16 and temperature compensation winding 17 can be formed by winding wire through holes 20 in core 12. However, those skilled in the art will appreciate that other methods for forming the permeability measurement winding 16 and the temperature compensation winding 17 are likewise suitable. For example, the permeability measurement winding 16 and the temperature compensation winding 17 may alternatively be formed by wrapping wire around core 12, without the use of such holes.

As a further option, the permeability winding 16 and/or the temperature compensation winding 17 can alternatively be formed by printed circuit board (PCB) fabrication techniques, such as those utilizing the deposition of copper plating upon a printed circuit board. As yet a further option, the permeability winding 16 and/or the temperature compensation winding can be formed by integrated circuit (IC) or micro electromechanical systems (MEMS) techniques.

A structure similar to that of core 12 having windings formed thereon is disclosed in U.S. Pat. No. 5,534,837, issued on Jul. 9, 1996 to Randy L. Brandt and assigned to the entity to which the present application is subject to an assignment. U.S. Pat. No. 5,534,837 is hereby explicitly incorporated herein by reference in its entirety.

Core 12 may be mounted within gap 25 by any desired means. The use of a non-ferrous mounting structure, such as a mounting structure comprised of a composite and/or polymer material, mitigates undesirable disruption or re-routing of the magnetic flux proximate gap 25. Gap 25 has a width, dimension A, that accommodates the thickness of core 12, including the permeability measurement winding 16 and the temperature compensation winding 17, if used, thereof. Dimension A can be sized such that core 12 is received within gap 25 with little or no room to spare.

Optionally, a temperature sensor 18 can be formed to core 12 to facilitate temperature compensation, so as to enhance an accuracy and precision of current measurements, as described in detail below. The temperature sensor 18 can comprise a thermocouple or any other desired type of temperature sensor.

Figure 5:
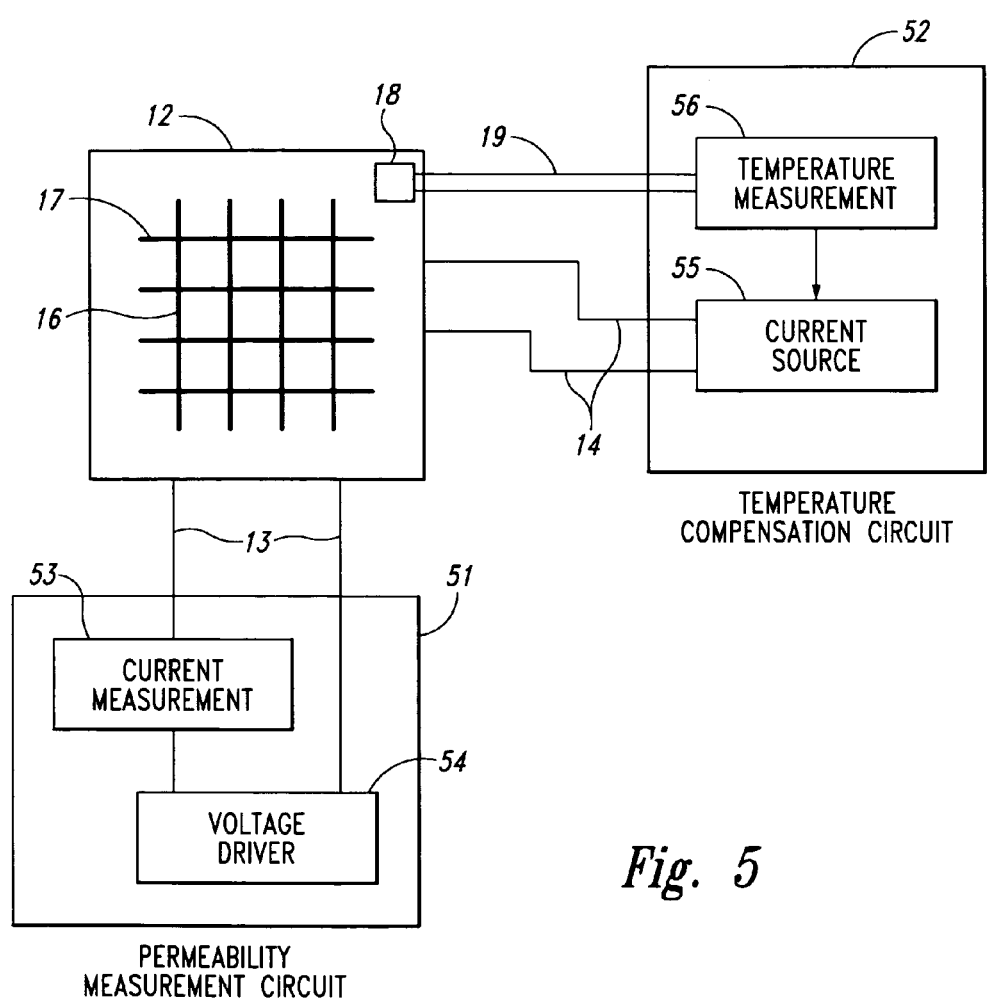
FIG. 5 is a block diagram showing electrical connection of the permeability measurement winding to a permeability measurement circuit and showing electrical connection of the temperature compensation winding to the temperature compensation circuit.

Referring now to FIG. 5, permeability measurement winding 16 can be in electrical communication with a permeability measurement circuit 51 via permeability measurement winding leads 13. A voltage driver 54 provides a voltage to permeability measurement winding 16. A current measurement circuit 53 measures current through permeability measurement winding 16 to facilitate the determination of current flow through the conductor 15 (FIG. 1), as discussed in detail below.

Temperature compensation winding 17 can be in electrical communication with a controlled current source 55 of a temperature compensation circuit 52 via temperature compensation winding leads 14. Temperature sensor 18 can be in electric communication with a temperature measurement circuit 56 of temperature compensation circuit 52 via temperature sensor leads 19. Temperature measurement circuit 56 can provide a control signal to controlled current source 55, so as to facilitate compensation for temperatures variations of core 12 and thus enhance an accuracy and precision of current measurement, as discussed in detail below.

In operation, current flow through conductor 15 can be determined by measuring a magnetic permeability of core 12. A magnetic permeability of core 12 is dependent, at least in part, upon the strength of a magnetic field formed about conductor 15. The strength of the magnetic field formed about conductor 15 is dependent, at least it part, upon the amount of current flowing through conductor 15. Thus, the permeability of core 12 is representative of the amount of current flowing through conductor 15.

The permeability of core 12 can be determined, for example, by applying a voltage to permeability measurement winding 16 via leads 13 and then measuring the resulting current flow through permeability measurement winding 16. The current response of permeability measurement winding 16 to voltage changes thereacross is proportional to the permeability of core 12. As those skilled in the art will appreciate, other methods for measuring the permeability of core 12 are likewise suitable.

The voltage can be applied to the permeability measurement winding 16 by voltage driver 54 of permeability measurement circuit 51. The resulting current through permeability winding 16 depends, at least in part, upon the inductance of an inductor defined by permeability measurement winding 16 and core 12. This inductance depends, at least in part, upon the magnetic permeability of core 12. Thus, measurement of the current response of permeability measurement winding 16 to a voltage applied thereto facilitates the determination of the permeability of core 12. The permeability of core 12 is representative of the amount of current flowing through conductor 15, as mentioned above.

Optionally, temperature compensation winding 17 varies the permeability of core 12 in a manner that compensates for temperature variations thereof. As those skilled in the art will appreciate, the permeability of core 12 is dependent, at least in part, upon the temperature thereof. In order to enhance an accuracy and precision of current measurement, temperature sensor 12 provides a temperature signal to temperature compensation circuit 52 that, in turn, provides a current control signal to temperature compensation winding 17. The current control signal causes temperature compensation winding 17 to vary a permeability of core 12 in a manner can mitigates permeability changes thereto due to temperature variations thereof.

More particularly, temperature sensor 18 provides a temperature signal to temperature measurement circuit 56. Temperature measurement circuit 56 provides a current control signal to controlled current source 55 that is dependent upon the temperature of core 12. In response to the current control signal, controlled current source 55 provides current to temperature compensation winding 17 that tends to compensate for temperature variations in core 12, so as to enhance performance of the DC temperature sensor of the present invention.

The need for a precise DC excitation source, as used in contemporary Hall effect DC current sensors, is mitigated. The voltage driver 54 of the present invention need not be precise, since voltage changes, rather than absolute voltages, can be used by the current measurement circuit 53 to determine current response. Indeed, the voltage driver may comprise an AC voltage source, if desired.

It is worthwhile to note that although such a flux concentrator is generally desirable in order to enhance a sensitivity and precision of the DC current sensor of the present invention, the use of a flux concentrator is not required. Thus, flux concentrator 11 may optionally be omitted. Omission of the flux concentrator may be beneficial in those instances where space is limited and/or precise current measurement is not necessary. If flux concentrator 11 is omitted, then the core 12 can be mounted to or proximate conductor 15 by any desired means, such as via a non-magnetic mounting bracket.

Embodiments described above illustrate but do not limit the invention. It should also be understood that numerous modifications and variations are possible in accordance with the principles of the present invention. Accordingly, the scope of the invention is defined only by the following claims.

I claim:

1. A DC current sensor comprising:
    a core comprising a magnetically permeable material;
    a permeability measurement winding formed around at least a portion of the core;
    a DC voltage driver configured to apply a DC voltage to the permeability measurement winding so as to effect current flow through the permeability measurement winding;
    a current measurement circuit configured to measure current flow through the permeability measurement winding in response to the voltage applied thereto by the DC voltage driver;
    a temperature compensation winding formed about at least a portion of the core;
    a temperature sensor formed upon the core;
    a temperature measurement circuit in electrical communication with the temperature sensor;
    a current source in electrical communication with the temperature measurement circuit and the temperature compensation winding, the current source being conjured to receive a current control signal from the temperature measurement circuit and to provide current to the temperature compensation winding in response to the current control signal, so as to mitigate variations in a permeability of the core due to temperature variations thereof; and
    wherein the core can be placed within a magnetic field of a conductor such that measurement of a permeability of the core via the permeability measurement winding facilitates determination of current flow through the conductor.

2. The DC current sensor as recited in claim 1, wherein the care is generally planar in configuration.

3. The DC current sensor as recited in claim 1, further comprising a flux concentrator configured to concentrate magnetic flux proximate the conductor onto the core.

4. The DC current sensor as recited in claim 1, further comprising a temperature compensation winding formed about at least a portion of the core.

5. The DC current sensor as recited in claim 1, further comprising a temperature compensation winding formed about at least a portion of the core, the temperature compensation winding being oriented approximately orthogonally with respect to the permeability measurement winding.

6. The DC current sensor as recited in claim 1, further comprising a temperature sensor formed upon the core.

7. A method of measuring DC current in a conductor, the method comprising:
    placing a core proximate the conductor such that a permeability of the core is affected by magnetic flux produced by current flow through the conductor; and
    determining a permeability of the core by applying a DC voltage to a permeability measurement winding and measuring current flow through the permeability winding wherein the permeability of the core being dependent upon a strength of a magnetic field formed about the conductor, the strength of the magnetic field being dependent upon the current flow through the conductor and the current flow through the permeability winding being dependent upon the permeability of the core.

8. The method of claim 7, wherein placing a core proximate a conductor comprises placing a core having a permeability measurement winding formed about a portion thereof proximate the conductor, the permeability measurement winding being oriented such that a magnetic field produced thereby is approximately orthogonal with respect to a magnetic field of the conductor.

9. The method of claim 7, wherein placing a core proximate a conductor comprises placing a core having a plurality of generally orthogonal windings formed thereabout proximate the conductor, the windings being oriented such that magnetic fields produced thereby are approximately orthogonal with respect to a magnetic field of the conductor, one of the windings varying an inductance of the core in a manner that compensates for temperature variations thereof.

10. The method of claim 7, further comprising placing a flux concentrator proximate the conductor, the core being placed at least partially within a gap of the flux concentrator.

11. The method of claim 7, further comprising placing a magnetically permeable toroid proximate the conductor, the core being placed at least partially within a gap of the toroid.

12. The method of claim 7, further comprising measuring a temperature of the core and using current flow to vary the permeability of the core in a manner that tends to mitigate permeability variations therein due to temperature variations thereof.

13. The method of claim 7, further comprising measuring a temperature of the core and varying the permeability of the core by varying current flow through a temperature compensation winding in a manner that tends to mitigate permeability variations therein due to temperature variations thereof.

14. A DC current sensor comprising:
a core comprising a magnetically permeable material;
a permeability measurement winding formed around at least a portion of the core;
a temperature compensation winding formed about at least a portion of the core;
a temperature sensor formed upon the core;
a temperature measurement circuit in electrical communication with the temperature sensor;
a current source in electrical communication with the temperature measurement circuit and the temperature compensation winding, the current source being configured to receive a current control signal from the temperature measurement circuit and to provide current to the temperature compensation winding in response to the current control signal, so as to mitigate variations in a permeability of the core due to temperature variations thereof; and
wherein the core can be placed within a magnetic field of a conductor such that measurement of a permeability of the core via the permeability measurement winding facilitates determination of current flow through the conductor.

15. The DC current sensor as recited in claim 14, wherein the temperature compensation winding is oriented approximately orthogonally with respect to the permeability measurement winding.

16. The DC current sensor as recited in claim 14, further comprising a temperature sensor formed upon the core.

* * * * *